United States Patent [19]

Ostoich

[11] Patent Number: 4,733,404
[45] Date of Patent: Mar. 22, 1988

[54] APPARATUS AND METHOD FOR SIGNAL PROCESSING

[75] Inventor: Vladimir E. Ostoich, San Jose, Calif.

[73] Assignee: Hewlett-Packard Company, Palo Alto, Calif.

[21] Appl. No.: 934,879

[22] Filed: Nov. 25, 1986

[51] Int. Cl.$^4$ .......................... H03D 3/24; H04L 7/02
[52] U.S. Cl. ........................................ 375/119; 375/4; 375/108; 375/110; 328/63; 328/72; 328/127
[58] Field of Search ................... 375/4, 110, 111, 108, 375/118–120; 371/47; 328/63, 72, 127

[56] References Cited

U.S. PATENT DOCUMENTS

| | | | |
|---|---|---|---|
| 3,209,261 | 9/1965 | Critchlow | 375/110 |
| 3,512,093 | 5/1970 | Perreault | 328/114 X |
| 3,611,161 | 10/1971 | Claxton | 375/110 X |

Primary Examiner—Stephen C. Buczinski
Assistant Examiner—Linda J. Wallace
Attorney, Agent, or Firm—Eugene H. Valet

[57] ABSTRACT

A transmission control circuit for use in a data terminal equipment receiver section is disclosed. The output of a phase locked loop or narrow band tuned filter input register clocking circuit which includes a quasi-differentiator and full wave rectifier is sent to a divider circuit and the divided clocking signal is then quasi-differentiated, full-wave rectified and used to drive a signal source circuit. The signal source circuit output has a polarity which is determined by the signal output of the full wave rectifier and is integrated and fed back to control inputs of the quasi-differentiators. An offset signal is also provided to the integrator. The result is an automatic adjustment of the pulse width to a fixed fraction of the input bit period.

16 Claims, 4 Drawing Figures

APPARATUS AND METHOD FOR SIGNAL PROCESSING

BACKGROUND OF THE INVENTION

1. Field of the Invention

The present invention generally relates to data communications and, more particularly, to signal processing for clock recovery and data re-timing in data link equipment operating in a receiver mode.

2. Description of the Related Art

Data communications is concerned with the movement and exchange of encoded information—a set or block of one or more encoded (e.g. digitally) alphabetic and numerical characters—between any two data terminal equipments (DTEs) in a communications link. One critical element to the reliable and efficient exchange of information is the correct timing synchronization of the transmitter and receiver.

In order for the receiving device to decode and interpret the incoming bit pattern on a communication link correctly, one of the flow parameters which it is necessary for the receiver to know is the bit rate being used, i.e., the time duration of each bit period. This is known as bit or clock synchronism. Hence, within each DTE there must be transmission control circuits—also known as communication interface circuits—which couple the device to the data link and which include timing synchronization among their functions. Retiming is also used to erase jitter caused by intersymbol interference and other link deficiencies.

Synchronism is accomplished in one of two ways which are determined by whether a transmitted and receiver clocks are independent (asynchronous) or synchronized (synchronous). In asynchronous transmission, data are generated at random intervals and start and stop bits are used for each character envelope in order to establish synchronism. In synchronous transmission, however, start and stop bits are not used. Instead, each frame is transmitted as a continuous stream of binary digits. A common method of synchronization is to have the information to be transmitted encoded in such a way that there are sufficient guaranteed transitions in the transmitted bit stream to resynchronize the receiver clock at frequent intervals.

The frequency spectrum of data transmitted in common, bandwidth-efficient, non-return to zero (NRZ) format has zero power at the bit-rate frequency. As known in the art, to recover the clock from an NRZ data stream, the data must be first quasi-differentiated and then submitted to full-wave rectification by the receiver communications interface circuits. A typical circuit is shown in FIG. 1; the corresponding waveform generation is shown in FIG. 2.

Referring to the FIGURES, waveform A represents an incoming, bandwidth limited, arbitrary NRZ data stream with a bit period of T on communication link 2. Waveform B is the same data stream after quasi-differentiation resulting in pulses of width d on interconnection line 4. Waveform C on line 6 is the pulse waveform B following full wave rectification; the spectrum of waveform C has a strong component at the clock frequency. Waveform C is processed through a phase locked loop circuit to produce a recovered, synchronized clock waveform D on line 8 as the clock pulse for sampling the input data A at the input flip-flop 11. A voltage controlled oscillator (receiver source clock) having a frequency equal to the bit rate being used on the data link is used by the phase locked loop circuit to derive the timing interval between successive samples of the received bit stream. By successive adjustments, the loop keeps the generated sampling transitions of clock pulses D close to the approximate center of each bit period.

As a result of the signal processing by the communication interface circuit described above, waveform E on line 10 is the input signal A retimed by sampling the incoming data stream A by the recovered clock pulse D.

This common technique is not without its drawbacks. In order to guarantee optimum sampling (vis., near the center of the bit period T) of the incoming data A by the clock pulse D, the recovered clock D must be in a specific phase relation with the incoming data A. However, the phase of the clock component recovered by the phase locked loop will be a strong function of the ratio of pulse width d in waveforms B and C to the bit period T.

If by operating the data link at different data rates the bit period T significantly changes, pulse width d must be changed proportionally to T in order to maintain proper sampling of bit stream A at the D flip flop. This is usually done by changing a component (such as a capacitor used to set the width d of the pulses of waveform C) in the quasi-differentiation circuit whenever changing the link data rate.

Hence, such prior art systems require complex changes when the bit rate is changed.

SUMMARY OF THE INVENTION

In a basic aspect, the present invention includes circuitry for synchronizing received information transmitted having various bit rates, said circuitry including an input register coupled to a communications link for receiving said information, signal shaping circuitry coupled to said communications link, and first clocking circuitry coupled to the output of said signal shaping circuitry and having an output to said register for clocking said register in synchronsim with said bit rates from said communications link, and further comprises a divider means, coupled to the output of said first clocking circuitry, for providing a divided clocking signal; second signal shaping means coupled to an output of said divider means for shaping said divided clocking signal; control means, coupled to an output of said second signal shaping means and having an output coupled to a control input of said first signal shaping means and to a control input of said second signal shaping means, for providing a signal to said first signal shaping means and to said second signal shaping means such that the outputs of said first shaping means and second shaping means are a function of the signal on the respective said control inputs. The control means provides an integrated drive signal which has a value determined by the output signal of the second signal shaping means.

It is an advantage of the present invention that it can provide a quasi-differentiation circuit which automatically keeps pulse width d equal to a fixed fraction of bit period T.

It is another advantage of the present invention that it can maintain a constant ratio between pulse width d and bit period T even if the bit rate is changed by more than an order of magnitude.

It is a further advantage of the present invention that it can decrease the number of components that need to be changed when changing the bit rate in the system.

It is yet another advantage of the present invention that a wide range of d/T ratios can be selected and automatically maintained over a wide range of expected incoming data rates without having to change any component in the quasi-differentiator circuits.

Other features and advantages of the present invention will become apparent upon consideration of the following detailed description and the accompanying drawings, in which like reference designations represent like features throughout the FIGURES.

BRIEF DESCRIPTION OF THE DRAWINGS

FIG. 4 is a set of waveform as relates to the various stages of signal processing by the embodiment of the present invention as shown in FIG. 3.

The drawings referred to in this description should be understood as not being drawn to scale except if specifically noted.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable. Aa will be obvious to a person skilled in the art, the phase locked loop can be replaced with a narrow band filter, tuned to the bit rate, followed by a pulse shaper. Common circuits can be replaced with functional equivalents. The specific circuitry and operation of the blocks of FIGS. 1 and 3 or their equivalents are well known to those skilled in the art; hence, no detailed description is necessary to an understanding of the concepts of this disclosure.

Reference to classical texts for details is suggested; e.g., Smith, R. J., *Circuits, Devices and Systems*, 2nd Ed., copy. 1971 by John Wiley & Sons, Inc.

Figure 1:
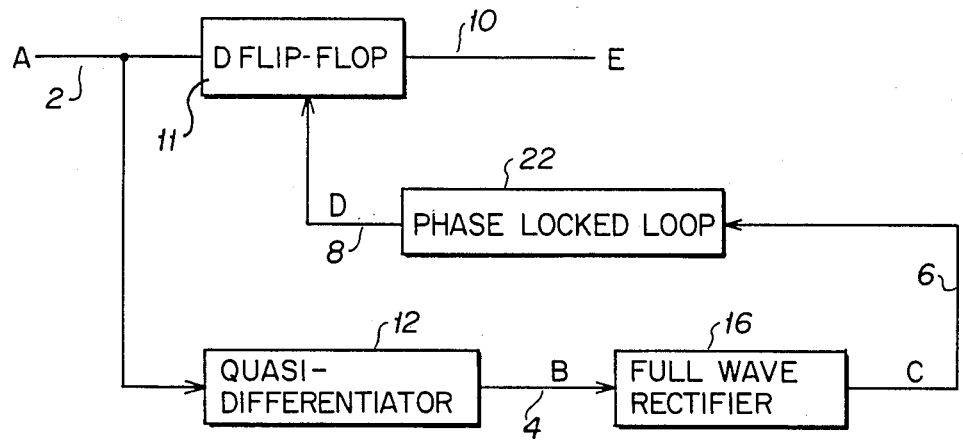
FIG. 1 (PRIOR ART) is a schematic diagram of an exemplary embodiment of a typical communication interface circuit for receiving and synchronizing input information signals transmitted having various bit rates.
Figure 3:
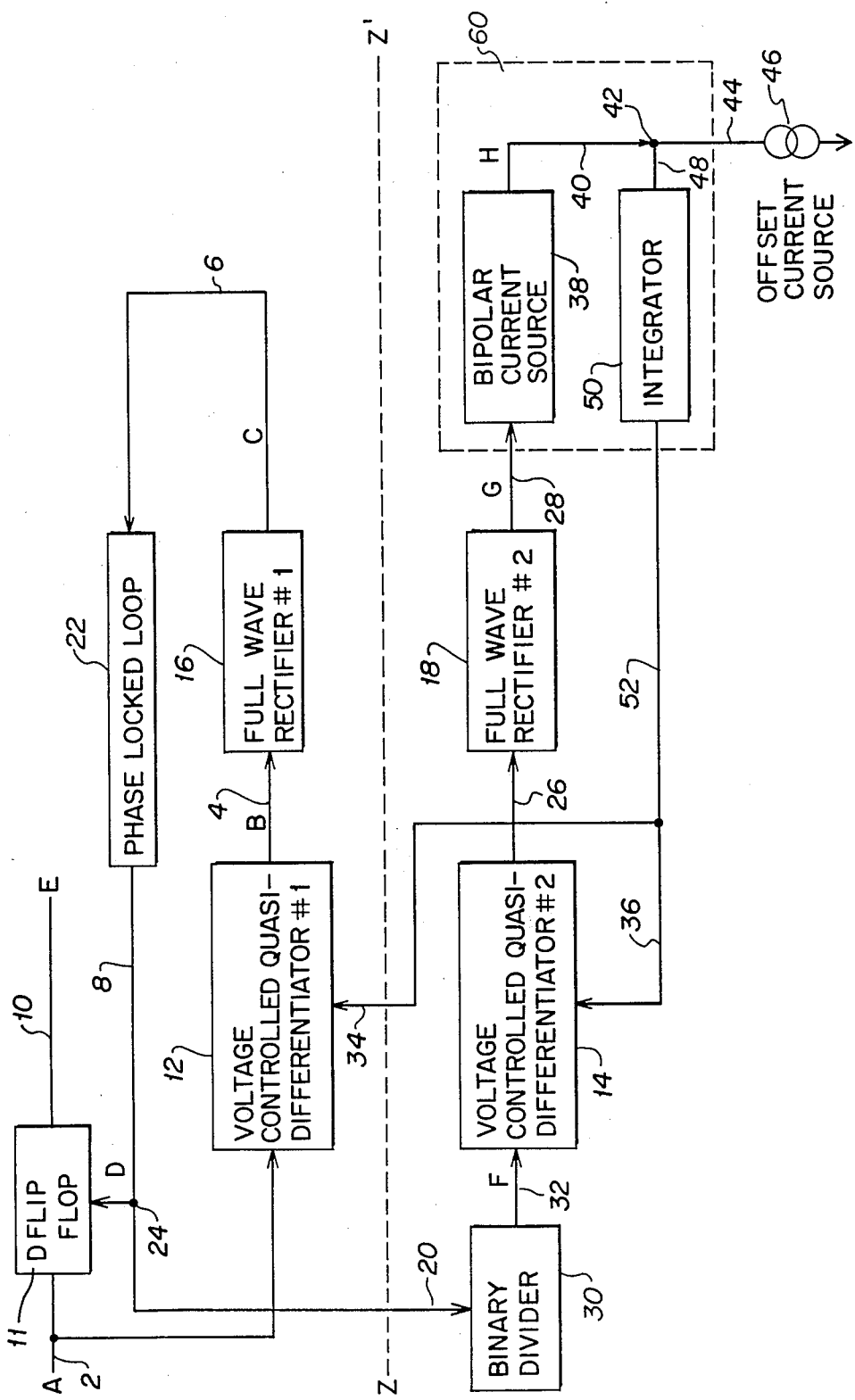
FIG. 3 is a schematic diagram of an embodiment of the present invention.

Referring to FIGS. 1 and 3, it will be readily recognized that the initial pulse shaping and phase locked loop circuitry coupled to the communications link and input D-type flip flop register are essentially the same. The difference between the known arrangement in FIG. 1 and the embodiment of FIG. 3 lies in the components below the reference line Z-Z' in FIG. 3.

In the present embodiment of the invention, there are two matched quasi-differentiators 12, 14 and two full wave rectifiers 16, 18 as shown in FIG. 3.

Figure 2:
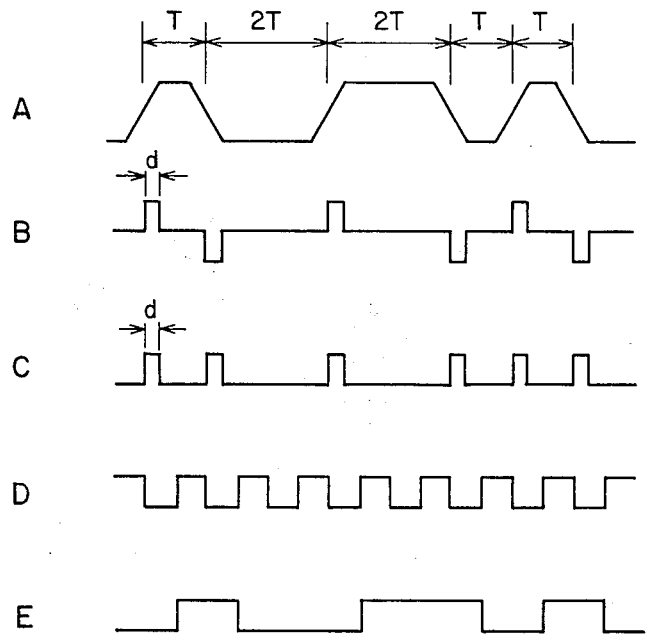
FIG. 2 (PRIOR ART) is a set of waveforms related to the stages of signal processing by the prior art circuit as shown in FIG. 1.

The first quasi-differentiator 12 and first full wave rectifier 16 work identically with the above description of FIGS. 1 and 2.

The second quasi-differentiator 14 has as its input 32 the output of phase locked loop circuit 22, viz. clocking waveform D, by being coupled to line 8 at node 24 through a divider circuit 30 (note that waveforms A through D in FIGS. 2 and 4 are identical; hence, reference to waveforms hereinafter refer to FIG. 4). In other words, the clocking waveform D drives the binary divider 30 which will output to the second quasi-differentiator 14 waveform F on line 32.

Note that waveform F is similar to an alternating zero-one sequence of a rate equal to the incoming data rate.

The output of the second quasi-differentiator 14 on line 26 is input to the second full wave rectifier 18. While the shaped signal, shown as waveform C, is fed to the phase locked loop circuit 22 input on line 6, the output signal waveform G from the second full wave rectifier 18 on line 28 is sent to feedback control circuitry 60. In effect, the series connected second quasi-differentiator 14 and the second full wave rectifier 18 form a second signal shaper which converts waveform F into waveform G, a continuous stream of pulses of width d'.

In order to guarantee a match between the pulse width d in waveform C and the pulse width d' in waveform G, the first and second quasi-differentiators 12, 14 and first and second full wave rectifiers 16, 18 are matched by using identical component values and circuit layouts. An identical control voltage signal is sent to each of the quasi-differentiators at control inputs 34, 36, respectively. The control voltage signal is derived as follows.

As stated above, the output waveform G is sent out to the feedback control circuitry 60 on line 28. This signal is used to drive a signal source circuit, such as a bipolar current source circuit 38. The current source 38 generates a current, I, of one polarity during the duration d' of the pulses of waveform G. The current source 38 generates a current, −I, of the opposite polarity between the pulses of waveform G. See waveform H. Coupled at node 42 to the output 40 of the bipolar current source 38 is an output 44 of an offset signal source, such as current source 46.

Also coupled to node 42 is the input 48 of an integrator circuit 50.

The bipolar current source 38 and offset current source 46 output signals to node 42 to drive a integrated transimpedance amplifier, referred to hereinafter as an integrator 50. The polarity of the signal at the input of the integrator 50 is determined by the signal output of said second shaping circuitry components.

The output 52 voltage of the integrator 50 thus supplies a control voltage to the quasi-differentiators 12, 14 via control inputs 34, 36, respectively. Hence, the pulse width d from the pulse shaping circuits will be a function of the voltage on the respective control inputs.

It again will be recognized by a person skilled in the art that feedback control circuitry 60 can be any common circuit which performs to provide an output signal which is the integral of the input signals; the components described for this embodiment are exemplary only. As the specific circuitry forming the components of the present embodiment of the invention are well known in the art, no detailed description is set forth herein.

In operation, for example, it can be assumed that even with an initially incorrect pulse width d, a clock waveform D of approximately correct frequency, but with incorrect phase, exists due to the phase locked loop 22 being adjusted to the expected incoming data bit rate. If the offset current at the integrator input 48 is set to zero, and if d' is not equal to T/2 (see waveform H), a net dc current component exists at the integrator input 48. This makes the voltage at the integrator output 52 change until $d' = T/2$ and the integrator input 48 goes to zero. If another data bit rate is expected and the phase locked loop oscillator is returned accordingly, pulse width $d'$ will automatically adjust itself again to guarantee $d' = T/2$.

If the d/T ratio which the circuit should achieve is different from $d/T = \frac{1}{2}$, a non-zero offset current must be provided from current source 46. Hence, with the disclosed embodiment, a wide range of d/T ratios can be selected and then automatically maintained over a wide range of expected incoming data rates without having to change any component in the quasi-differentiators. The present invention is seen thusly to eliminate the need, for example, of an external, exchangeable capacitor on the quasi-differentiator 12 which would be used in the prior art to control the pulse width d.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application to thereby enable others skilled in the art to understand the invention for various embodiments and with various modifications as are suited to the particular use contemplated. Furthermore, as will be obvious to a person skilled in the art, the embodiment described herein could be and is specifically contemplated to be implemented in integrated circuit form. It is intended that the scope of the invention be defined the by the claims appended hereto and their equivalents.

What is claimed is:

1. Circuitry means for synchronizing received information transmitted having various bit rates, said circuitry means including holding means coupled to a communications link for receiving said information, signal shaping means coupled to said communications link for receiving said information, and a first clocking means coupled between said signal shaping means and said holding means for clocking said holding means in synchronism with said bit rates from said communications link, comprising:
    divider means, coupled to an output of said first clocking means, for providing a divided clocking signal;
    second signal shaping means, coupled to an output of said divider means, for shaping said divided clocking signal;
    control means, coupled to an output of said second signal shaping means and having an output coupled to a control input of said first signal shaping means and to a control input of said second signal shaping means, for providing a signal to said first signal shaping means and said second signal shaping means such that output signals of said first shaping means and said second shaping means are a function of the signal to the respective said control inputs.

2. The circuitry as set forth in claim 1, further comprising:
    said first signal shaping means and said second signal shaping means being matched.

3. The circuitry as set forth in claim 2, wherein output signals from said first and second signal shaping means have a duration proportional to a fraction of input bit signal duration.

4. The circuitry as set forth in claim 3, wherein said first and second signal shaping means comprise;
    matched, voltage controlled quasi-differentiator circuits; and
    matched, full wave rectifier circuits coupled respectively in series following said voltage controlled quasi-differentiators.

5. The circuitry as set forth in claim 4, wherein said control means further comprises:
    signal source means for providing a drive signal output, which has a polarity determined by said signal output of said second signal shaping means; and
    an integrator circuit coupled in series following said signal source means.

6. The circuitry as set forth in claim 5 wherein said control means further comprises:
    offset signal source means coupled to the input of said integrator circuit for providing an offset signal to said integrator circuit.

7. A communication interface circuit means for data link equipment coupled to a communications link for receiving and synchronizing input information signals transmitted having various bit rates, said means including input register means coupled to said link for receiving said information in the form of binary data bits, signal shaping means coupled to said link for shaping said signals, and clocking means coupling said shaping means to said input register means for sampling said information signals into said data link equipment, further comprising:
    divider circuit means, coupled to an output of said clocking means, for providing a divided binary clocking signal;
    second signal shaping means, coupled to an output of said divider circuit means, for shaping said divided binary clocking signal and providing an output signal;
    control means, coupled to an output of said second signal shaping means and having an output coupled to a control input of said first signal shaping means and to a control input of said second signal shaping means, for providing a signal to said first signal shaping means and said second signal shaping means such that the output of said first shaping means and second the output shaping means are a function of the signal on the respective said control inputs.

8. The circuit as set forth in claim 7, wherein said first and second shaping means further comprise:
    matched first and second, voltage controlled quasi-differentiator circuits; and
    matched first and second, full wave rectifier circuits coupled respectively in series to the output of said voltage controlled quasi-differentiator circuits.

9. The circuit as set forth in claim 8, wherein said control means comprises:
    current source for providing a driving output signal which has a polarity determined by said output signal of said second signal shaping means; and
    an integrator circuit coupled in series to said current source output.

10. The circuit as set forth in claim 9, wherein said current source further comprises:
    a bipolar current source having an input coupled to an output of said second full wave rectifier and an output coupled to an input of said integrator circuit.

11. The circuit as set forth in claim 10, wherein said control means further comprises:

an offset current source coupled to said input of said integrator circuit.

12. The circuit as set forth in claim 7, wherein output signals from said first and second signal shaping means have a duration proportional to a predetermined faction of input bit signal duration.

13. An improved transmission control circuit for synchronizing received data into a data terminal equipment having input circuitry coupling said equipment to a communications link interconnect line, said circuitry including a D-type flip-flop circuit having an input coupled to said line, a first quasi-differentiator circuit having an input coupled to said line, a first full wave rectifier circuit having an input coupled to the output of said first quasi-differentiator circuit, and a clocking circuit having an input coupled to the output of said first full wave rectifier circuit and an output coupled to a clock input of said flip-flop characterized by:

a binary divider circuit having an input coupled to an output of said circuit clocking circuit output;

a second quasi-differentiator circuit having a first input coupled to an output of said binary divider circuit;

a second full wave rectifier circuit having an input coupled to an output of said second quasi-differentiator circuit;

a bipolar current source having an input coupled to an output of said second full wave rectifier;

an offset current source coupled to an output of said bipolar current source circuit; and an integrator circuit having an input coupled to an output of said bipolar current source and to an output of said offset current source such that the input signal on said integrator input has a polarity determined by said signal output of said second full wave rectifier circuit, and having an output coupled to a control signal input of said first quasi-differentiator circuit and to a control signal input of said second quasi-differentiator circuit.

14. The improved circuit as set forth in claim 13, further comprising:

said first quasi-differentiator circuit and said second quasi-differentiator circuit being matched.

15. The improved circuit as set forth in claim 14, further comprising:

said first full wave rectifier circuit and said second full wave rectifier circuit being matched.

16. The improved circuit as set forth in claim 13, wherein output signals from said first and said second quasi-differentiator circuits have a duration proportional to a predetermined fraction of input bit signal duration.

* * * * *

UNITED STATES PATENT AND TRADEMARK OFFICE
CERTIFICATE OF CORRECTION

PATENT NO.   :  4,733,404

DATED        :  Mar. 22, 1988

INVENTOR(S)  :  Vladimir E. Ostoich

It is certified that error appears in the above-identified patent and that said Letters Patent is hereby corrected as shown below:

Column 3, line 38, "Aa" should be --As--;
Column 6, line 46, "second the output" should be --the output second--;
Column 6, line 51, "matched first and second" should be --first and second, matched --.
Column 6, line 53, "matched first and second" should be --first and second, matched --.
Column 6, line 54, "output" should be --outputs--;
Column 7, line 9, "faction" should be --fraction--;
Column 7, line 23, Insert --circuit-- after "flip flop".

Signed and Sealed this

Nineteenth Day of December, 1989

Attest:

JEFFREY M. SAMUELS

Attesting Officer          Acting Commissioner of Patents and Trademarks